(12) United States Patent
Wang et al.

(10) Patent No.: US 6,864,106 B1
(45) Date of Patent: Mar. 8, 2005

(54) METHOD AND SYSTEM FOR DETECTING TUNNEL OXIDE ENCROACHMENT ON A MEMORY DEVICE

(75) Inventors: Zhigang Wang, Santa Clara, CA (US); Nian Yang, San Jose, CA (US); Xin Guo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 137 days.

(21) Appl. No.: 10/217,965

(22) Filed: Aug. 12, 2002

(51) Int. Cl.[7] .................. H01L 21/66; G01R 31/26; G01R 27/28
(52) U.S. Cl. .................. 438/14; 702/117
(58) Field of Search .................. 438/14; 702/117; 324/76.1, 522, 765, 768, 769

(56) References Cited

U.S. PATENT DOCUMENTS 6,684,173 B2 * 1/2004 Kessenich et al. .......... 702/117
6,697,753 B2 * 2/2004 Samuelson et al. .......... 702/117
6,738,289 B2 * 5/2004 Gongwer et al. ...... 365/185.12

* cited by examiner

Primary Examiner—David S. Blum (57) ABSTRACT

A method for detecting tunnel oxide encroachment on a memory device. In one method embodiment, the present invention applies a baseline voltage burst to a gate of the memory device. Next, the present embodiment generates a baseline performance distribution graph of bit line current as a function of gate voltage for the memory device. The present embodiment then applies a channel program voltage burst to the gate of the memory device. Moreover, the present embodiment generates a channel program performance distribution graph of bit line current as a function of gate voltage for the memory device. The present embodiment then applies a channel erase voltage burst to the gate of the memory device. Additionally, the present embodiment generates a channel erase performance distribution graph of bit line current as a function of gate voltage for the memory device. A comparison of the channel program performance distribution graph and the channel erase performance distribution graph with respect to said baseline performance distribution graph is then performed. In so doing, an asymmetric distribution of the channel program performance distribution graph and the channel erase performance distribution graph with respect to the baseline performance distribution indicates tunnel oxide encroachment.

7 Claims, 7 Drawing Sheets

METHOD AND SYSTEM FOR DETECTING TUNNEL OXIDE ENCROACHMENT ON A MEMORY DEVICE

FIELD OF THE INVENTION

The present invention relates to the field of memory devices. Specifically, the present invention relates to detecting tunnel oxide encroachment on a memory device.

BACKGROUND ART

Presently, electronic memories come in a variety of forms and serve a variety of purposes. For example, one type of memory is flash memory. Generally, flash memories are used for easy and fast information storage in devices such as digital cameras and home video consoles. It is used more as a hard drive than as random access memory (RAM). In fact, flash memory may be considered a solid state storage device (e.g., no moving parts—everything is electronic).

In general, flash memory is a type of electrically erasable programmable read-only memory (EEPROM). It has a grid of columns and rows with a cell that has two transistors at each intersection. The two transistors are separated from each other by a thin tunnel oxide (TOX) layer. One of the transistors is a floating gate, and the other one is a control gate. The floating gate's only link to the row is through the control gate. As long as the link is in place, the cell has a value of one. To change the value to a zero requires a process called Fowler-Nordheim (FN) tunneling.

FN tunneling is used to alter the placement of electrons in the floating gate. For example, an electrical charge is applied to the floating gate and drains to the ground. This charge causes the floating-gate transistor to act similar to an electron gun. That is, the electrons are pushed through and trapped on the other side of the TOX layer, giving it a negative charge. These negatively charged electrons act as a barrier between the control gate and the floating gate. A cell sensor then monitors the level of the charge passing through the floating gate. If the flow through the gate is greater than 50 percent of the charge, then it has a value of one. However, when the charge passing through the gate drops below the 50 percent threshold, the value changes to zero. Normally, a blank EEPROM has all of the gates fully open, giving each cell a value of one.

The electrons in the cells of a flash-memory can be retuned normal (e.g., one) by the application of an electric field (e.g., a higher voltage charge). Furthermore, flash memory utilizes in-circuit wiring to apply the electric field either to the entire chip or to predetermined sections known as blocks. This electrical field erases the target area of the chip, which can then be rewritten. Therefore, flash memory works much faster than traditional EEPROMS because instead of erasing one byte at a time, it erases a block or the entire chip. In addition, flash memory will maintain its data without an external source of power. Thus, it is extremely useful with removable memory media such as digital cameras, digital music players, video consoles, computers, and the like.

However, in order for a flash memory device to operate at peak performance, the TOX layer needs to be as flat as possible. Any variations, such as TOX thickening, TOX thinning, or the like, result in a TOX encroachment issue. That is, the TOX layer may have varying thickness from the center to the edges. This lack of uniformity can result in difficulty during programming or erasing of the memory. One cause of TOX encroachment is the post oxidation process (POP). For example, after an etching process, different defects such as segregated edge defects may be found in the memory device. In order to repair the defects, POP is applied. However, POP may cause TOX encroachment on the channel. Additionally, the amount of time required for POP is not standard. That is, the process varies between devices. Therefore, the amount/effects of TOX encroachment are not easily quantified.

Thus, a need exists for a method and system for detecting tunnel oxide encroachment on a memory device. A further need exists for a method and system for detecting tunnel oxide encroachment on a memory device that can quantify the extent of the encroachment. Yet another need exists for a method and system for detecting tunnel oxide encroachment on a memory device which can be applied during the manufacturing process. A further need exists for a method which meets the above needs and which is compatible with existing memory manufacturing processes.

SUMMARY OF INVENTION

The present invention provides, in various embodiments, a method and system for detecting tunnel oxide encroachment on a memory device. Furthermore, the present invention provides a method and system for detecting tunnel oxide encroachment on a memory device that can quantify the extent of the encroachment. Additionally, the present invention provides a method and system for detecting tunnel oxide encroachment on a memory device during the manufacturing process. Moreover, the present invention provides a method which meets the above needs and which is compatible with existing memory manufacturing processes.

Specifically, in one embodiment, the present invention applies a baseline voltage burst to a gate of the memory device. Next, the present embodiment generates a baseline performance distribution graph of bit line current as a function of gate voltage for the memory device. The present embodiment then applies a channel program voltage burst to the gate of the memory device. Moreover, the present embodiment generates a channel program performance distribution graph of bit line current as a function of gate voltage for the memory device. The present embodiment then applies a channel erase voltage burst to the gate of the memory device. Additionally, the present embodiment generates a channel erase performance distribution graph of bit line current as a function of gate voltage for the memory device. A comparison of the channel program performance distribution graph and the channel erase performance distribution graph with respect to said baseline performance distribution graph is then performed. In so doing, an asymmetric distribution of the channel program performance distribution graph and the channel erase performance distribution graph with respect to the baseline performance distribution indicates tunnel oxide encroachment.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances well-known methods, procedures, components, and circuits have not been described in detail as not to unnecessarily obscure aspects of the present invention.

Notation and Nomenclature

Some portions of the detailed descriptions which follow are presented in terms of procedures, logic blocks, processing, and other symbolic representations of operations on data bits within an electronic computing device and/or memory system. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a computer system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "partitioning", "receiving", "processing", "applying", "storing", "delivering", "accessing", "generating", "providing", "separating", "outputting", "performing", "comparing" or the like, refer to the action and processes of a computer system, or similar electronic computing device, that manipulates and transforms data. The data is represented as physical (electronic) quantities within the computing device's registers and memories and is transformed into other data similarly represented as physical quantities within the computing device's memories or registers or other such information storage, transmission, or display devices.

Figure 1A:
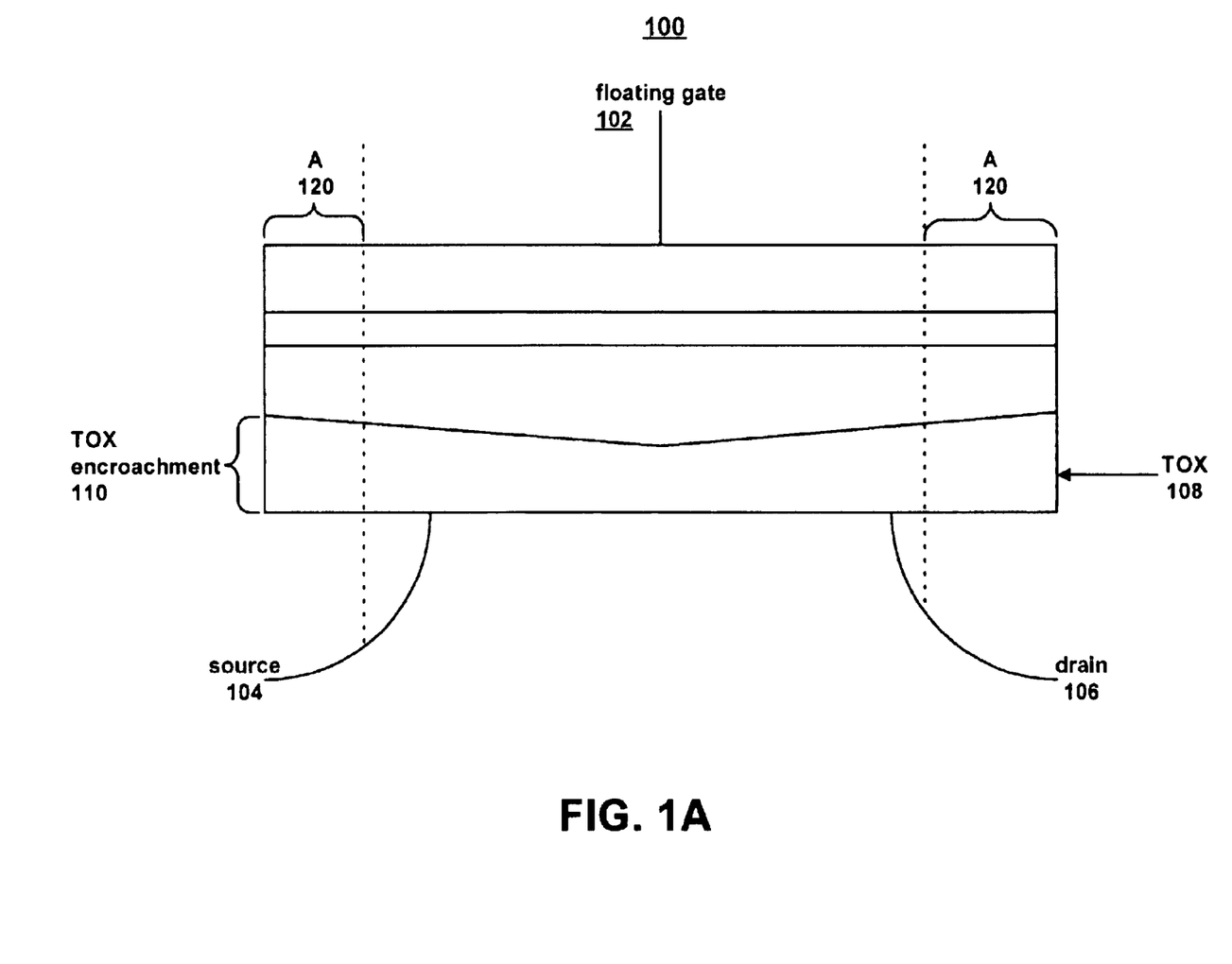
FIGS. 1A–1B are block diagrams of the exemplary effect of tunnel oxide encroachment on different sized memory devices.
Figure 1B:
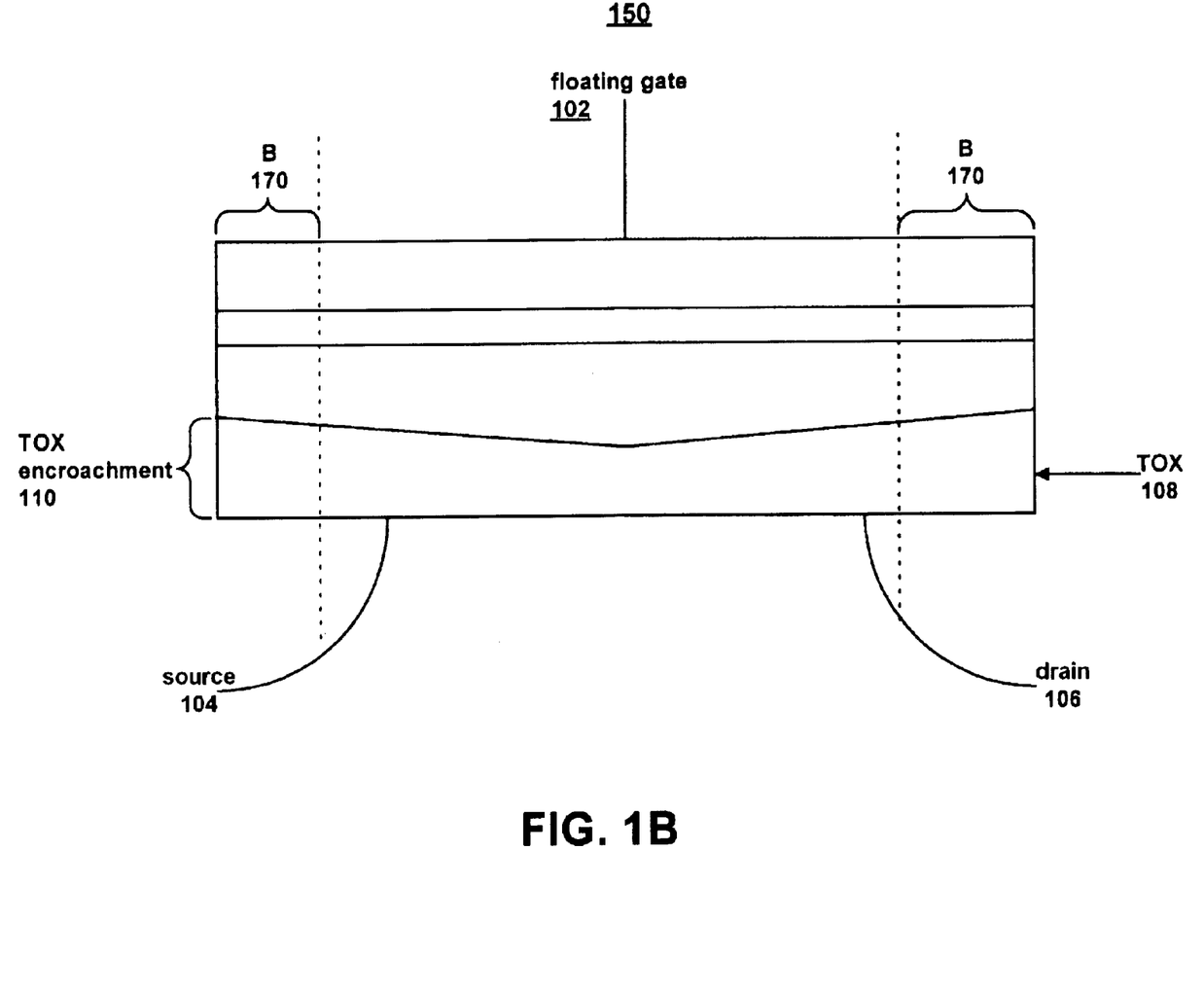

With reference now to FIGS. 1A and 1B, a normal sized flash memory device 100 and a reduced size flash memory device 150 are shown. In addition, flash memory devices 100 and 150 both show the effects of TOX encroachment 110. In one embodiment, TOX encroachment 110 may be caused by the oxidation of the floating gate poly-one layer 105, which in turn leads to an uneven TOX thickness of the cells and a lack of uniformity. In another embodiment, TOX encroachment 110 may be caused by an error in the manufacturing line, materials utilized in the manufacturing process, manufacturing environment, temperature, or the like.

As shown in FIG. 1A, when the TOX channel is longer, fixing the edges of the memory device using POP is acceptable. For example, the portion of the memory device 100 effected by TOX encroachment 110 are shown by portions A120. In most manufacturing lines, the total of all portions of A120 may be 20 percent of the overall length of TOX layer 108. Thus, although TOX encroachment 110 occurs, approximately 80 percent of TOX layer 108 utilized by memory device 100 is within tolerance.

However, with reference now to FIG. 1B, as the memory device is reduced in size, and the channel length decreases, TOX encroachment 110, as measured by the total of all portions of B170, may be as large as 50 percent. In such a case, only 50 percent of TOX layer 108 utilized by memory device 150 is within tolerance. Therefore, as the size of memory device 100 is reduced, deleterious process induced TOX encroachment 110 dramatically increases.

In one embodiment, TOX encroachment 110 results in a non-uniform layer of tunnel oxide. Therefore, the electrons cannot easily pass through TOX layer 108 due to the additional width of the TOX layer 108. This non-uniformity of the TOX layer 108 may cause programming of memory device 100 to fail due to the inability of the electrons to tunnel through the excessive length of TOX layer 108. For example, in one embodiment, a normal TOX layer 108 has a thickness of 100 angstroms plus or minus 10 angstroms. However, after TOX encroachment 110, TOX layer 108 may have a thickness of greater than 110 angstroms plus or minus 10 angstroms. This results in a much higher voltage requirement in order to pass electrons across TOX layer 108. Therefore, no programming (or very little programming) of the memory device may occur.

Figure 2:
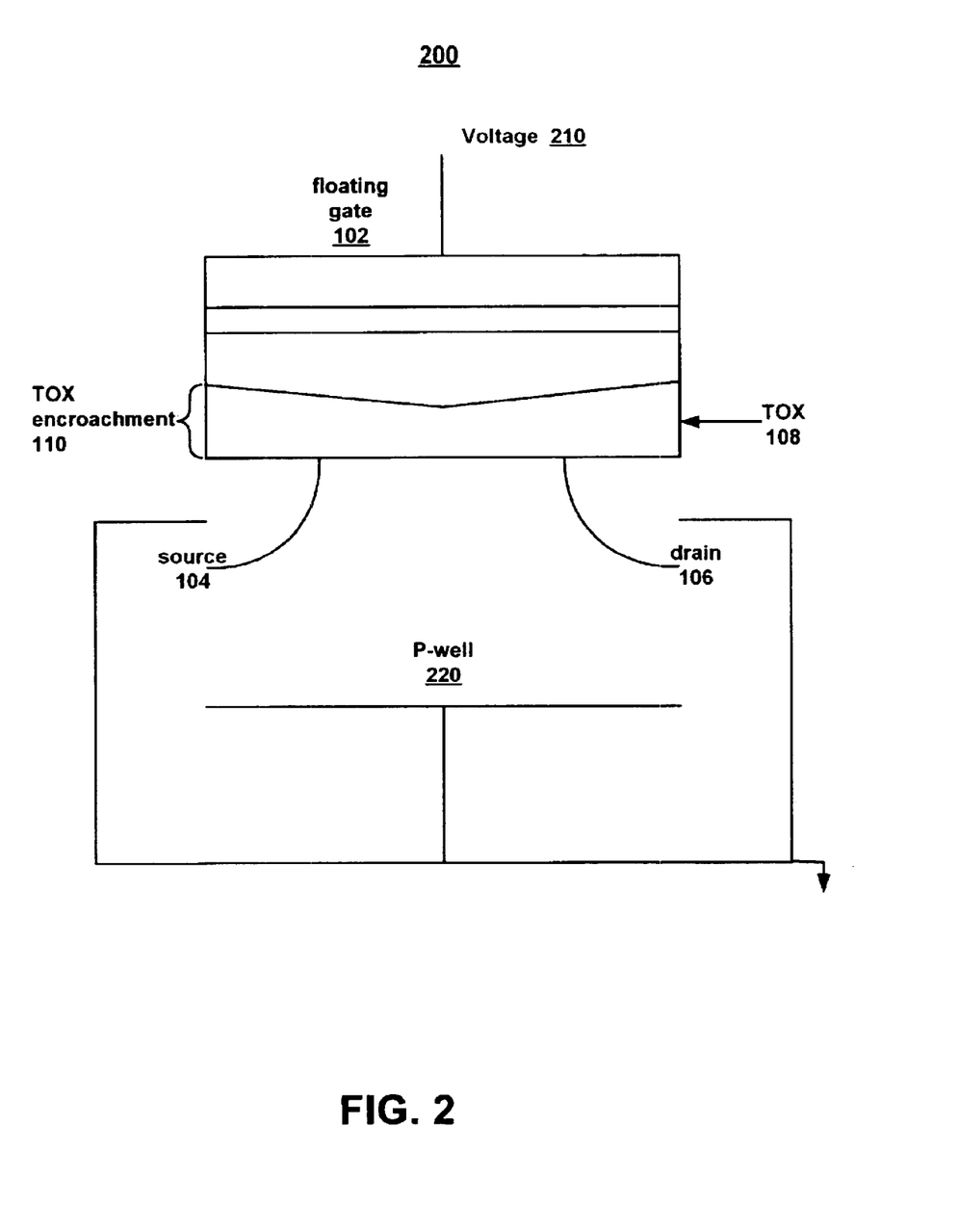
FIG. 2 is a block diagram of an exemplary method for detecting tunnel oxide encroachment on a memory device in accordance with an embodiment of the present invention.

With reference now to FIGS. 2, a block diagram of an exemplary method for detecting TOX encroachment 110 on a memory device 200 is shown. In one embodiment, memory device 200 is a memory device, such as flash memory device. Moreover, memory device 200 may be deleteriously effected by TOX encroachment 110 resulting in a degraded interface between floating gate 102 and TOX LAYER 108, where sharp "angular" shaped TOX disrupts an otherwise flat surface. In one embodiment, TOX encroachment 110 may be caused by poly floating gate oxidation. The present embodiment is utilized to test memory device 200 in order to detect unacceptable levels of TOX encroachment 110. In another embodiment, the test for TOX encroachment 110 on memory device 200 may be further utilized to quantify the level of TOX encroachment 110. Furthermore, memory device 200 may be tested while in the manufacturing process. Thus, with the system and method stated herein, TOX encroachment 110 may be detected during the manufacturing process thereby allowing rectification of the TOX encroachment 110 effected memory device 200 while still within the manufacturing environment.

Figure 4:
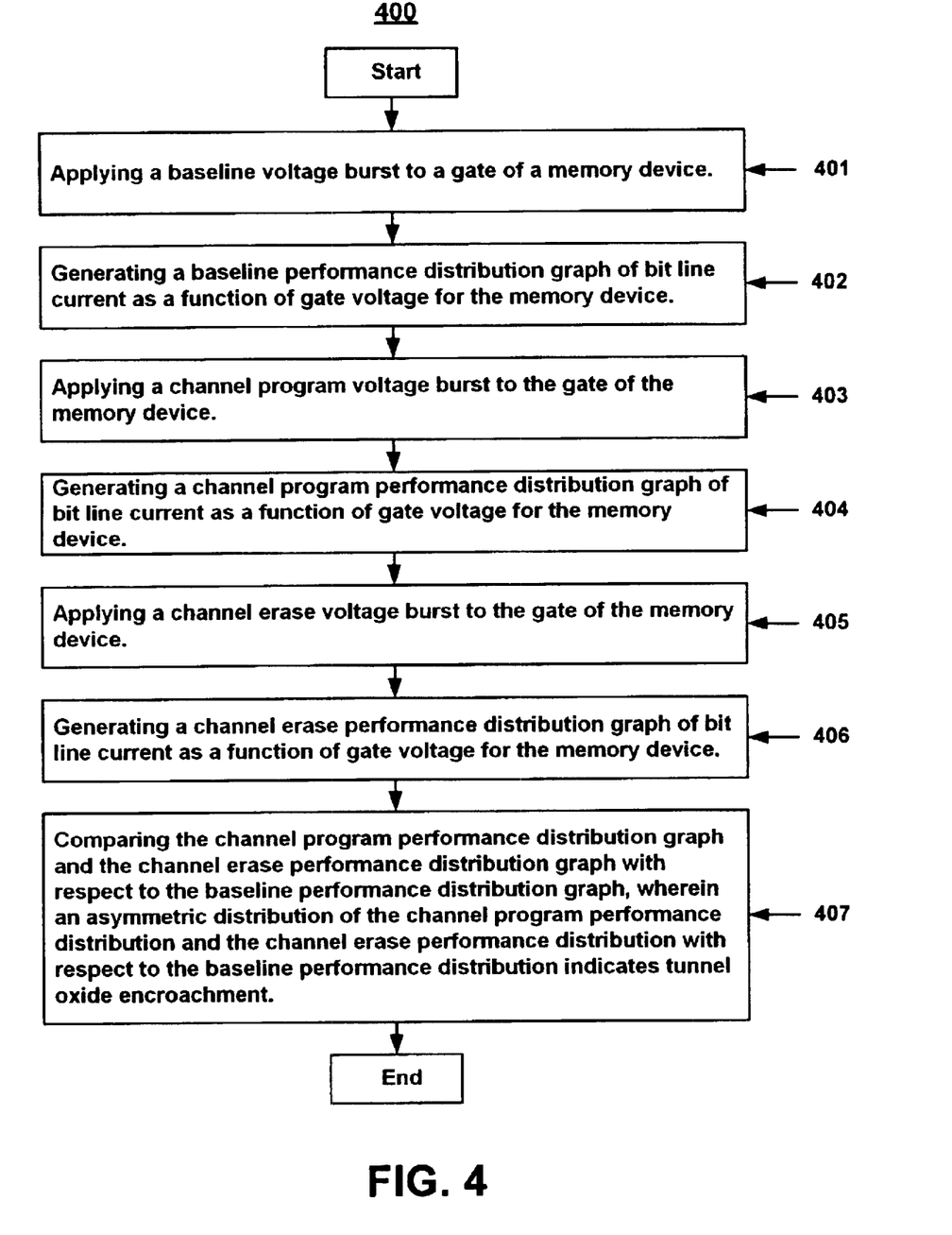
FIG. 4 is a flowchart of steps performed in accordance with one embodiment of the present invention for detecting tunnel oxide encroachment on a memory device.

With reference still to FIG. 2 and now to step 401 of FIG. 4, the present embodiment applies a baseline voltage burst to floating gate 102 of a memory device 200. For example, a baseline voltage burst of one volt may be applied to floating gate 102 for 100 milliseconds. During the application of the baseline voltage burst, source 104, drain 106, and p-well 220 are grounded. The baseline voltage burst may be used to establish a neutral state within memory device 200. In general, the baseline voltage burst allows memory device 200 to be set to a known baseline. Although a specific voltage and time are stated herein, the present invention is well suited to the use of a higher or lower baseline voltage as well as an increase or decrease in the timeframe in which the voltage is applied. The specified voltage and time are used merely for purposes of brevity and clarity.

Figure 3A:
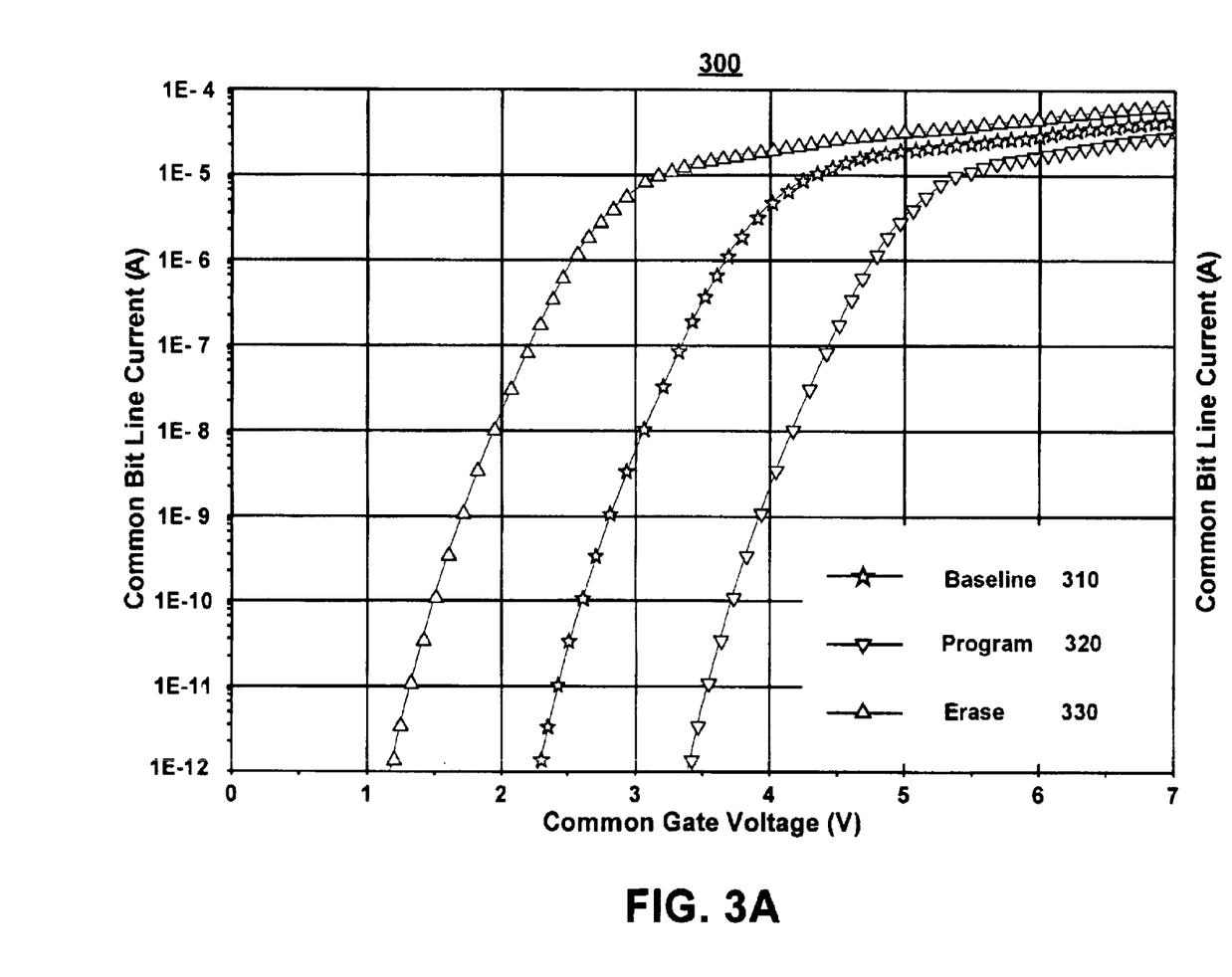
FIGS. 3A–3B are exemplary graphs in accordance with an embodiment of the present invention for detecting tunnel oxide encroachment on a memory device.
Figure 3B:
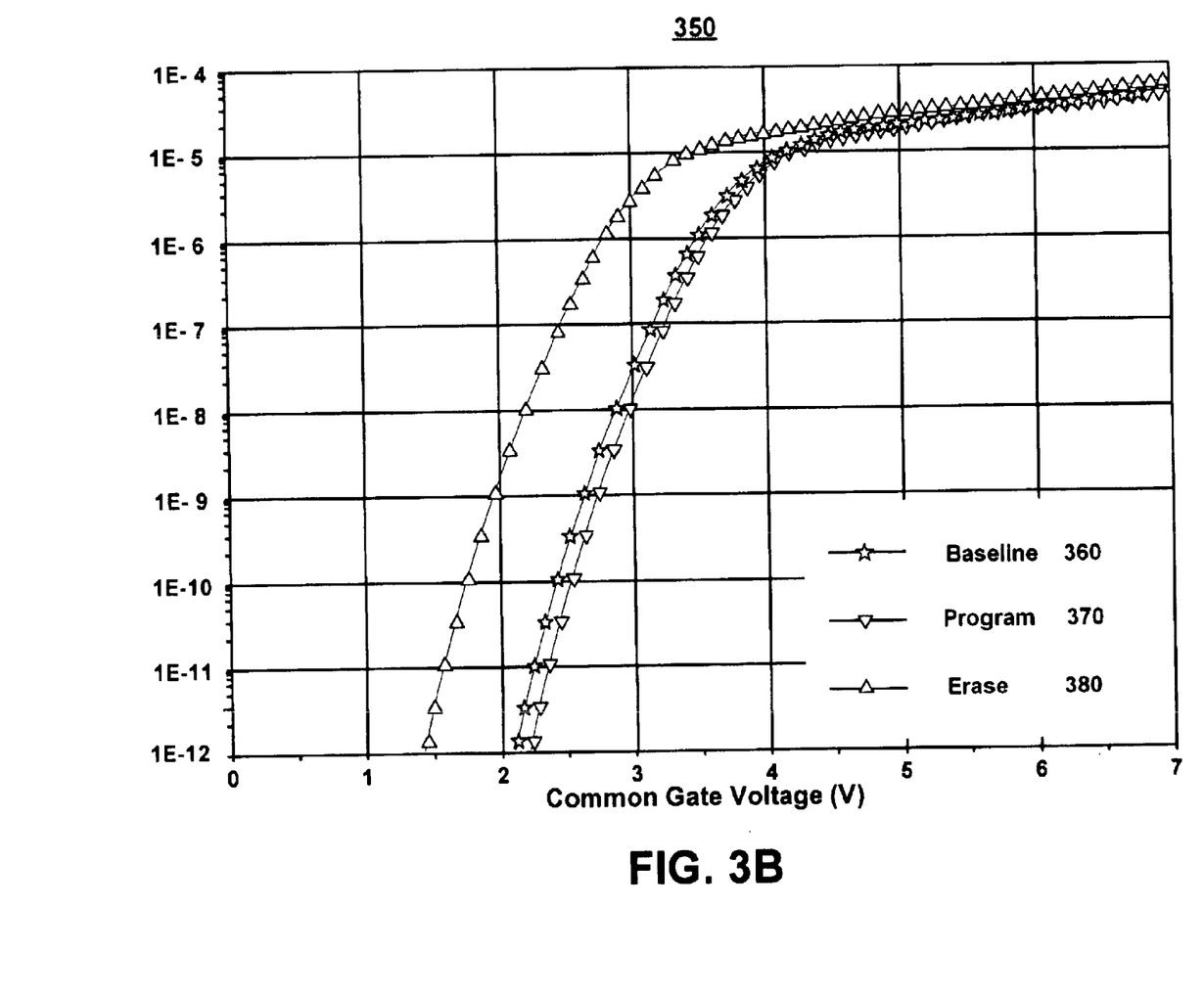

Referring still to FIG. 2 and now to step 402 of FIG. 4, a baseline performance distribution graph of bit line current as a function of gate voltage is generated for the memory device 200. In one embodiment, a common gate voltage 210 is applied to memory device 200 in increasing increments. During the application of the common gate voltage 210, a common bit line current is measured as an output. The resulting data is plotted in a graphical format. FIGS. 3A and 3B show a plot of baseline performance distribution graph (e.g., 310 and 360) of bit line current as a function of gate voltage.

With reference still to FIG. 2 and now to step 403 of FIG. 4, the present embodiment applies a channel program voltage burst to floating gate 102 of memory device 200. In one embodiment, channel program voltage burst is a Fowler-Nordheim (FN) channel program with positive gate bias. For example, a channel program voltage burst of 18 volts may be applied to floating gate 102 for 100 milliseconds. During the application of the channel program voltage burst, source 104, drain 106, and p-well 220 are grounded.

The channel program voltage burst is used to establish a program state within memory device 200. In general, the channel program voltage burst allows memory device 200 to be set to a programmable state. Although a specific voltage and time are stated herein, the present invention is well suited to the use of a higher or lower channel program voltage as well as an increase or decrease in the timeframe in which the voltage is applied. The specified voltage and time are used merely for purposes of brevity and clarity.

Referring still to FIG. 2 and now to step 404 of FIG. 4, a channel program performance distribution graph of bit line current as a function of gate voltage is generated for the memory device 200. In one embodiment, a common gate voltage 210 is applied to memory device 200 in increasing increments. During the application of the common gate voltage 210, a common bit line current is measured as an output. The resulting data is plotted in a graphical format. FIGS. 3A and 3B show a plot of channel program performance distribution graph (e.g., 320 and 370) of bit line current as a function of gate voltage.

With reference still to FIG. 2 and now to step 405 of FIG. 4, the present embodiment applies a channel erase voltage burst to floating gate 102 of memory device 200. In one embodiment, channel erase voltage burst is a FN channel program with negative gate bias. For example, a channel erase voltage burst of −17 volts may be applied to floating gate 102 for 100 milliseconds. During the application of the channel erase voltage burst, source 104, drain 106, and p-well 220 are grounded.

The channel erase voltage burst is used to establish an erase state within memory device 200. In general, the channel erase voltage burst allows memory device 200 to be set to a clean state. Although a specific voltage and time are stated herein, the present invention is well suited to the use of a higher or lower channel erase voltage as well as an increase or decrease in the timeframe in which the voltage is applied. The specified voltage and time are used merely for purposes of brevity and clarity.

Referring still to FIG. 2 and now to step 406 of FIG. 4, a channel erase performance distribution graph of bit line current as a function of gate voltage is generated for the memory device 200. In one embodiment, a common gate voltage 210 is applied to memory device 200 in increasing increments. During the application of the common gate voltage 210, common bit line current is measured as an output. The resulting data is plotted in a graphical format. FIGS. 3A and 3B show a plot of channel erase performance distribution graph (e.g., 330 and 380) of bit line current as a function of gate voltage.

With reference now to FIG. 3 and step 407 of FIG. 4, in one embodiment a comparison of the channel program performance distribution graph (e.g., 320 and 370) and the channel erase performance distribution graph (e.g., 330 and 370) with respect to the baseline performance distribution graph (e.g., 310 and 360) is performed.

Examples of the comparison are shown in the bit line current as a function of gate voltage graphs of FIGS. 3A and 3B. In one embodiment, Graphs 300 and 350 show a common bit line current ranging from 1E-12 to 1E-4, and a gate voltage ranging from zero to 7 volts. As stated herein, as the gate voltage is increased throughout its range of voltages, the common bit line current is measured as an output. Although a specific range of voltages and current is stated herein, the present embodiment is well suited to the use of a wider or narrower range. The utilization of the herein-mentioned ranges is done merely for purposes of brevity and clarity.

FIG. 3A shows a graphical analysis of a test performed on a memory device (e.g., 300) which is operating correctly (e.g., no TOX encroachment). In general, as shown in FIG. 3A, a symmetric distribution of channel program performance distribution graph 320 and channel erase performance distribution graph 330 with respect to baseline performance distribution 310 are indicators of a lack of TOX encroachment 110.

However, FIG. 3B shows a test performed on a memory device (e.g., 300) which is not operating correctly (e.g., has TOX encroachment). In general, as shown in FIG. 3B, an asymmetric distribution of channel program performance distribution graph 370 and channel erase performance distribution graph 380 with respect to baseline performance distribution 360 indicates the presence of TOX encroachment 110. Furthermore, FIG. 3B shows that the presence of TOX encroachment 110 further reduces the erase speed. In one embodiment, the gaussean distribution starts to spread out during the channel erase as some electrons move early and others move later due to the non-homogeneity of TOX layer 108.

Additionally, FIG. 3B shows that the presence of TOX encroachment further reduces the program speed. For example, a comparison of channel program 370 as shown in FIG. 3B is much slower than that of channel program 320 as shown in FIG. 3A. Thus, when a channel program state is selected for a device having TOX encroachment, some of the memory devices program and some do not. This effect, shown in channel program 370 of FIG. 3B, occurs due to the minimum voltage requirements of the electrons trying to cross TOX layer 108. Specifically, since TOX layer 108 is non-homogenous only a tail of the distribution is programmed. Therefore, fewer electrons are stored causing the capacitor to hold less charge. Although many performance effects are shown in graphs 300 and 350, it is the lack of symmetry between the three distributions that signals TOX encroachment.

Figure 5:
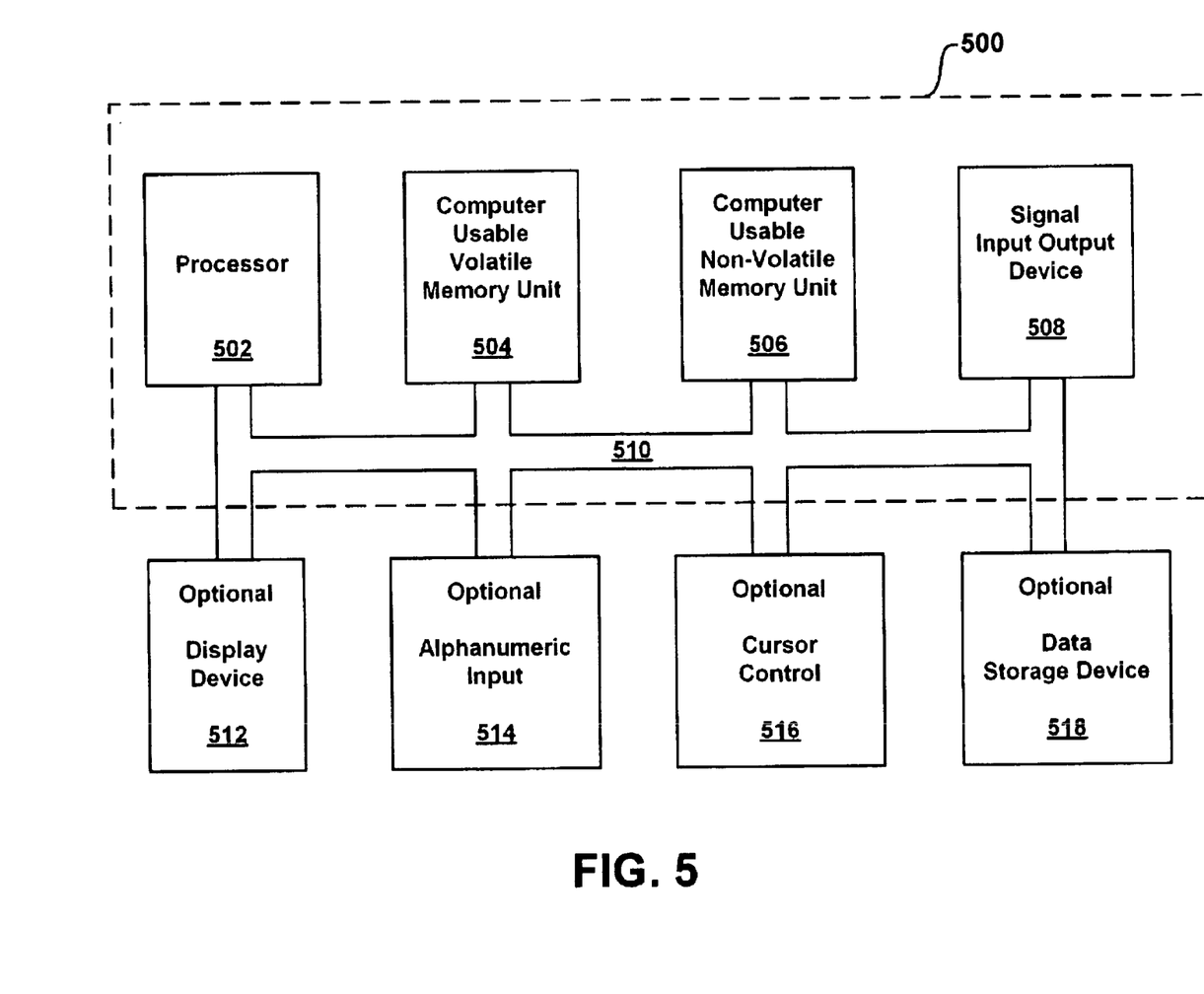
FIG. 5 is a block diagram of an embodiment of an exemplary computer system used in accordance with the present invention.

With reference now to FIG. 5, a block diagram of an embodiment of an exemplary computer system 500 used in accordance with the present invention. It should be appreciated that system 500 is not strictly limited to be a computer system. As such, system 500 of the present embodiment is well suited to be any type of computing device (e.g., server computer, portable computing device, desktop computer, mobile phone, pager, personal digital assistant, etc.). Within the following discussions of the present invention, certain processes and steps are discussed that are realized, in one embodiment, as a series of instructions (e.g., software program) that reside within computer readable memory units of computer system 500 and executed by a processor(s) of system 500. When executed, the instructions cause computer 500 to perform specific actions and exhibit specific behavior that is described in detail herein.

Computer system 500 of FIG. 5 comprises an address/data bus 510 for communicating information, one or more central processors 502 coupled with bus 510 for processing information and instructions. Central processor unit(s) 502 may be a microprocessor or any other type of processor. The computer 500 also includes data storage features such as a computer usable volatile memory unit 504 (e.g., random access memory, static RAM, dynamic RAM, etc.) coupled with bus 510 for storing information and instructions for central processor(s) 502, a computer usable non-volatile memory unit 506 (e.g., read only memory, programmable ROM, flash memory, EPROM, EEPROM, etc.) coupled with bus 510 for storing static information and instructions for processor(s) 502. System 500 also includes one or more signal generating and receiving devices 508 coupled with bus 510 for enabling system 500 to interface with other electronic devices and computer systems. The communication interface(s) 508 of the present embodiment may include wired and/or wireless communication technology. For example, within the present embodiment, the communication interface 508 may be a serial communication port, a Universal Serial Bus (USB), an Ethernet adapter, a FireWire (IEEE 1394) interface, a parallel port, a small computer system interface (SCSI) bus interface, infrared (IR) communication port, Bluetooth wireless communication port, a broadband interface, or an interface to the Internet, among others.

Optionally, computer system 500 may include an alphanumeric input device 514 including alphanumeric and function keys coupled to the bus 510 for communicating information and command selections to the central processor(s) 502. The computer 500 can include an optional cursor control or cursor directing device 516 coupled to the bus 510 for communicating user input information and command selections to the central processor(s) 502. The cursor-directing device 516 may be implemented using a number of well known devices such as a mouse, a track-ball, a track-pad, an optical tracking device, and a touch screen, among others. Alternatively, it is appreciated that a cursor may be directed and/or activated via input from the alphanumeric input device 514 using special keys and key sequence commands. The present embodiment is also well suited to directing a cursor by other means such as, for example, voice commands.

The system 500 of FIG. 5 may also include one or more optional computer usable data storage devices 518 such as a magnetic or optical disk and disk drive (e.g., hard drive or floppy diskette) coupled with bus 510 for storing information and instructions. An optional display device 512 is coupled to bus 510 of system 500 for displaying video and/or graphics. It should be appreciated that optional display device 512 may be a cathode ray tube (CRT), flat panel liquid crystal display (LCD), field emission display (FED), plasma display or any other display device suitable for displaying video and/or graphic images and alphanumeric characters recognizable to a user.

Thus, the present invention provides, in various embodiments, a method and system for detecting tunnel oxide encroachment on a memory device. Furthermore, the present invention provides a method and system for detecting tunnel oxide encroachment on a memory device and quantifying the extent of the encroachment. Additionally, the present invention provides a method and system for detecting tunnel oxide encroachment on a memory device which may be accomplished during manufacture. Moreover, the present invention provides a method which meets the above needs and which is compatible with existing memory manufacturing processes.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for detecting tunnel oxide encroachment on a memory device comprising:

applying a baseline voltage burst to a gate of said memory device;

generating a baseline performance distribution graph of bit line current as a function of gate voltage for said memory device;

applying a channel program voltage burst to said gate of said memory device;

generating a channel program performance distribution graph of bit line current as a function of gate voltage for said memory device;

applying a channel erase voltage burst to said gate of said memory device;

generating a channel erase performance distribution graph of bit line current as a function of gate voltage for said memory device; and comparing said channel program performance distribution graph and said channel erase performance distribution graph with respect to said baseline performance distribution graph, wherein an asymmetric distribution of said channel program performance distribution graph and said channel erase performance distribution graph with respect to said baseline performance distribution indicates tunnel oxide encroachment.

2. The method as recited in claim 1 wherein said detecting tunnel oxide encroachment on a memory device further comprises:

analyzing said channel program performance distribution graph and said channel erase performance distribution graph with respect to said baseline performance distribution graph to quantify said tunnel oxide encroachment.

3. The method as recited in claim 1 wherein said baseline voltage burst is 1 volt applied to the gate for 100 milliseconds.

4. The method as recited in claim 1 wherein said channel program voltage burst is a Fowler-Nordheim (FN) channel program with positive gate bias.

5. The method as recited in claim 4 wherein said positive gate bias is 18 volts applied to the gate for 100 milliseconds.

6. The method as recited in claim 1 wherein said channel erase voltage burst is a Fowler-Nordheim (FN) channel erase with negative gate bias.

7. The method as recited in claim 6 wherein said negative gate bias is −17 volts applied to the gate for 100 milliseconds.

* * * * *